United States Patent [19]
Lee et al.

[11] Patent Number: 6,090,695
[45] Date of Patent: Jul. 18, 2000

[54] METHOD FOR FORMING SELF-ALIGNED LANDING PADS

[75] Inventors: Jin-Hwa Lee, Taipei; Chia-Wen Liang, Hsinchu Hsien, both of Taiwan

[73] Assignee: United Microelectronics Corp., Hsinchu, Taiwan

[21] Appl. No.: 09/145,926

[22] Filed: Sep. 3, 1998

[30]    Foreign Application Priority Data

Jun. 17, 1998 [TW]   Taiwan .................................. 87109656

[51] Int. Cl.⁷ ..................................................... H01L 21/44
[52] U.S. Cl. .......................... 438/597; 438/637; 438/672; 438/399
[58] Field of Search ..................................... 438/597, 612, 438/637, 647, 675, 253, 256, 396, 399, 672

[56]          References Cited

U.S. PATENT DOCUMENTS

| | | | |
|---|---|---|---|
| 5,387,533 | 2/1995 | Kim ......................................... | 438/253 |
| 5,854,127 | 12/1998 | Pan ........................................... | 438/629 |
| 6,025,227 | 2/2000 | Sung et al. ............................... | 438/253 |
| 6,037,216 | 3/2000 | Liu et al. .................................. | 438/253 |

*Primary Examiner*—Tuan H. Nguyen
*Attorney, Agent, or Firm*—Hickman Stephens Coleman & Hughes, LLP

[57]              ABSTRACT

A method for forming self-aligned landing pads on a substrate containing a pre-formed first conducting layer and a pre-formed first insulator, wherein the substrate further includes a patterned second insulator to form contact openings exposing the substrate. A second conducting layer in formed on the substrate. A photoresist layer is formed on the second conducting layer and patterned to transfer the pattern onto the second conducting layer. The second conducting layer is patterned to expose the first insulator. Then, an etching back process is performed to selectively remove more of the second conducting layer in order to form the self-aligned landing pads.

14 Claims, 3 Drawing Sheets

METHOD FOR FORMING SELF-ALIGNED LANDING PADS

CROSS-REFERENCE TO RELATED APPLICATION

This application claims the priority benefit of Taiwan application serial no. 87109656, filed Jun. 17, 1998, the full disclosure of which is incorporated herein by reference.

BACKGROUND OF THE INVENTION

1. Field of the Invention

This invention relates to a method for fabricating a semiconductor device, and more particularly to a method for forming self-aligned landing pads.

2. Description of Related Art

Currently, the line width of the semiconductor fabrication process is already at the sub-micron level. Downsizing the line width of the fabrication process is an approach to improve the efficiency of a semiconductor device, and reduce the fabrication cost as well. Downsizing a semiconductor device can be partially accomplished by improving the resolution of some fabrication processes, such as photolithography dry etching processes. More advanced exposure equipment and more sensitive photoresists are certainly required for a sub-micron photolithography process. More precise and advanced etching equipment and methods are also needed for transferring patterns more correctly and successfully. Although developing advanced equipment and methods helps to downsize a semiconductor device, the task is still mainly dependent on minimizing the structure of a semiconductor device.

For example, in order to minimize a semiconductor device, a conducting structure used to connect a bit line or a node in an upper layer of the source/drain regions of a transistor in a lower layer has to be minimized. Methods according to the foregoing goal have been developed and used, wherein the methods include placing a narrow polysilicon plug between the bit line and the source/drain regions underneath. However, forming a narrow polysilicon plug on the source/drain regions and then forming a bit line over the polysilicon plug require very precise photolithography processes that are difficult to accomplish when line width is at the sub-micron level.

FIGS. 1A through 1C are cross-sectional views showing a conventional landing pad. Referring to FIG. 1A, a provided substrate 100 contains transistor 106 consisting of a gate 102 and a spacer 104, wherein the gate 102 further includes a conducting layer (not shown) and a insulator (not shown). A conducting layer 110 is formed to cover the entire substrate 100.

FIG. 1B shows formation of a patterned photoresist layer 112 on the conducting layer 110. The pattern is then transferred onto the conducting layer 110.

In FIG. 1C, a portion of the conducting layer 110 is removed to expose the gate 102. The sections of divided conducting layer 110' work as the landing pads between transistors 106. Since the patterns for forming the landing pads are separated, the distance between landing pads is limited by the resolution of the photolithography. Generally, the distance between landing pads has to be greater than 0.22 $\mu$m. As the design rule is downsized, the limitation of the photolithography resolution downsizes the windows of photolithography process, and that increases the difficulty of the fabrication process.

SUMMARY OF THE INVENTION

It is therefore an objective of the present invention to provide a method for forming a self-aligned landing pad. The method according to the invention is able to form landing pads on a smaller device by using only one mask, wherein the mask contains a non-separated landing pad pattern. By applying a self-aligned method to increase the fabrication windows, the distance between pads is narrowed as well.

In accordance with the foregoing objective of the present invention, the invention provides a method for forming a self-aligned landing pad, wherein the method includes forming a second insulator on a substrate that contains a first conducting layer and a first insulator. The method starts by forming a second conducting layer on the substrate, and then forming a photoresist layer on the substrate to transfer a pattern onto the second conducting layer. The second conducting layer is patterned to expose a portion of the second insulator. Next, an etching back process selectively removes the second conducting layer until the first insulator is exposed. By such a self-aligned method, the contact window is formed to expose the first insulator for forming a landing pad.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

As shown in FIGS. 2A through 2D, the invention provides a new method for forming self-aligned landing pads.

Figure 1A:
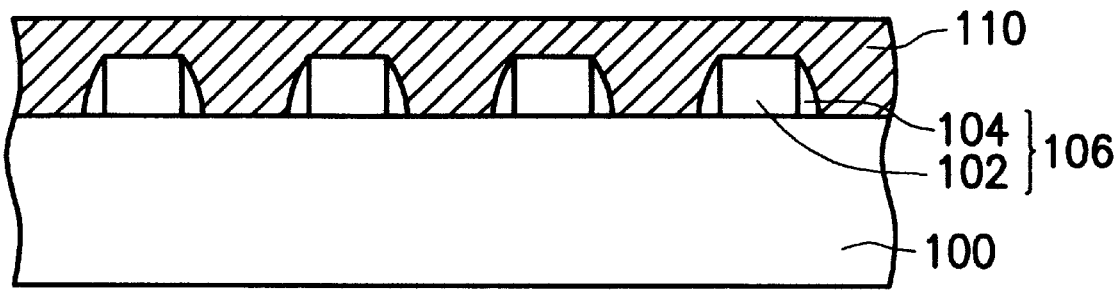
FIGS. 1A to 1C are cross-sectional views showing a conventional landing pad.
Figure 1B:
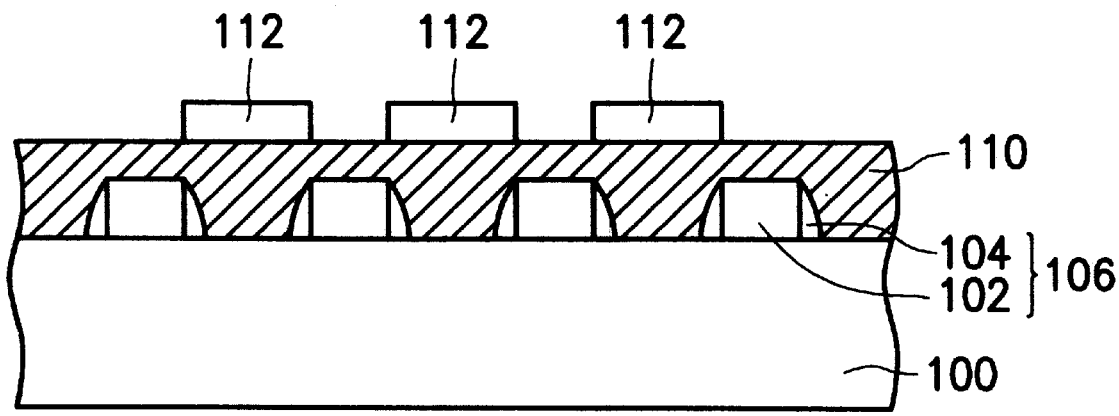
Figure 1C:
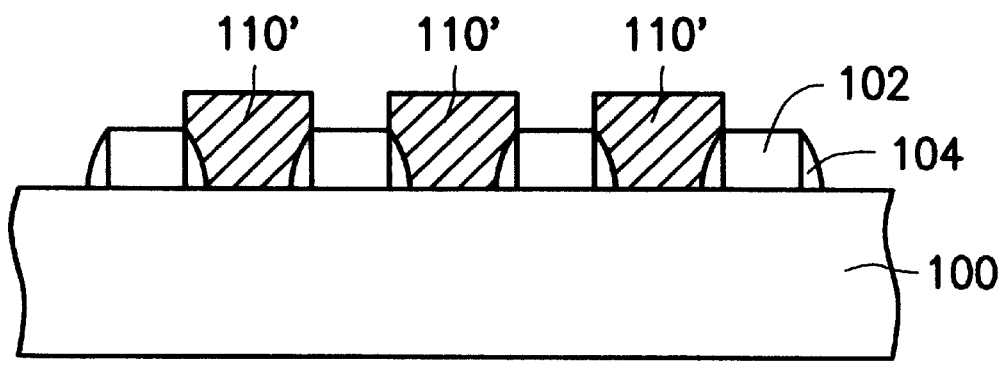
Figure 2A:
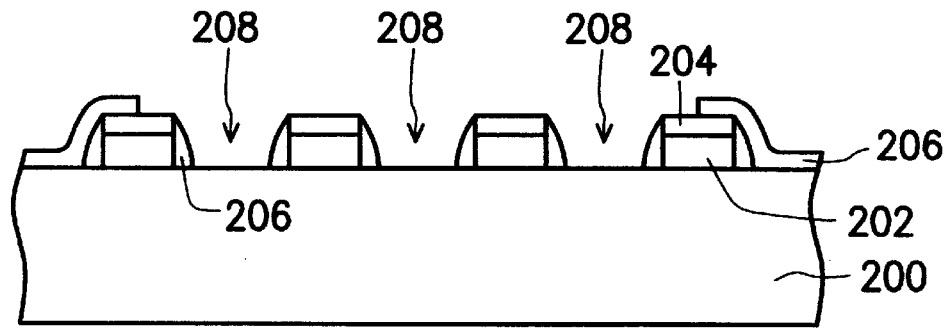
FIGS. 2A to 2D are cross-sectional views showing the landing pad of a preferred embodiment according to the invention.

Referring to FIG. 2A, a patterned second insulator 206 is formed on a provided substrate 200 to form the contact openings 208 that expose the substrate 200, wherein the substrate 200 contains patterned first conducting layer 202 and first insulator 204. The first conducting layer 202 includes polysilicon and the first insulator 204 and the second insulator 206 include oxide or silicon nitride.

Figure 2B:
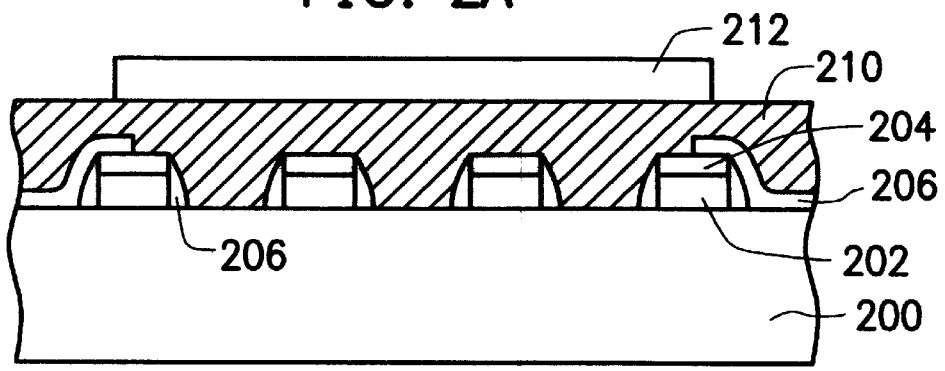

Referring to FIG. 2B, a second conducting layer 210 is formed on the substrate 200 to cover the foregoing structure, wherein the second conducting layer 210 includes polysilicon. A photoresist layer 212 is formed on the second conducting layer 210. The photoresist layer 212 is then patterned, and the pattern on the photoresist layer 212 is transferred onto the second conducting layer 210. The pattern correspondingly covers an area above the contact openings 208 on the substrate 200 underneath.

Figure 2C:
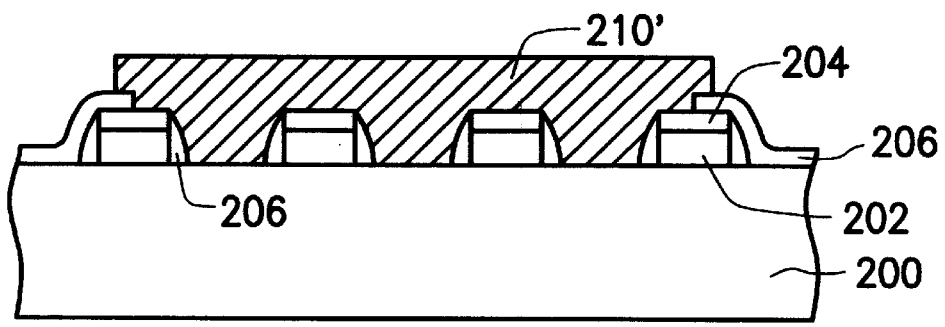

Referring to FIG. 2C, a portion of the second conducting layer 210 that is not covered by the patterned photoresist layer 212 is removed. The remaining second conducting layer 210' covers an area correspondingly covering the location of the contact openings 208 beneath. The process used to remove the portion of second conducting layer 210 includes a selective etching process. The photoresist layer 212 is also removed after the etching process performed on the second conducting layer is done.

Figure 2D:
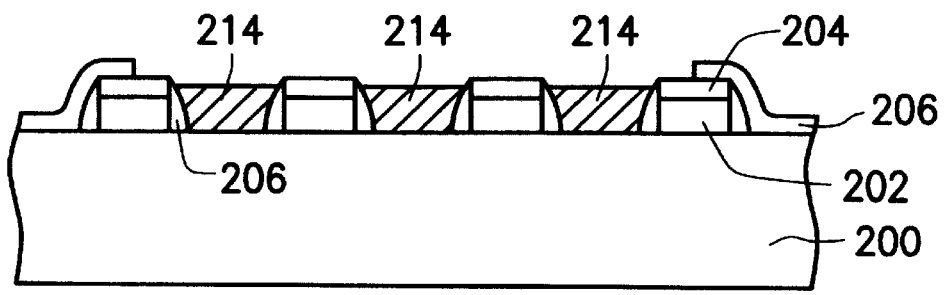

Referring next to FIG. 2D, the remaining second conducting layer 210' is selectively removed by an etching back process to expose the first insulator 204. The etching back process doesn't require any masks to form the self-aligned landing pad 214. Because the landing pad is formed by a self-aligned method, the dimension of the contact opening is not limited by the resolution of the photolithography. So, the method of the invention can be used in fabricating devices of smaller dimensions.

Figure 3A:
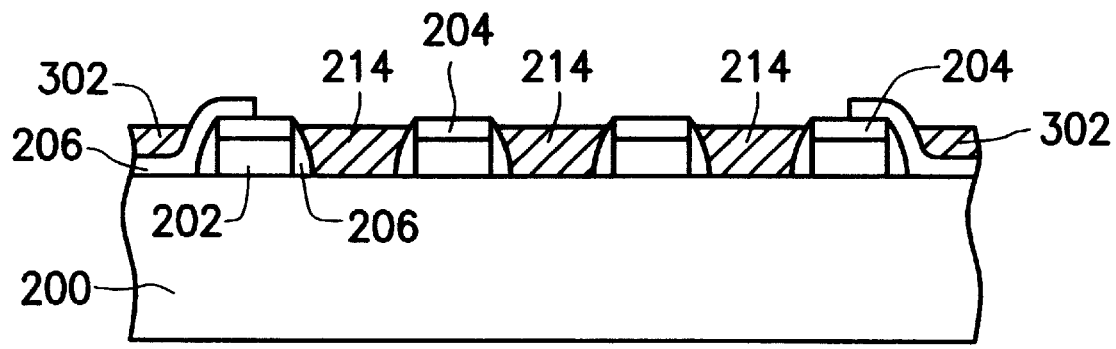
FIGS. 3A to 3B are cross-sectional views showing the result of changing the order of the steps shown in FIGS. 2B and 2C.
Figure 3B:
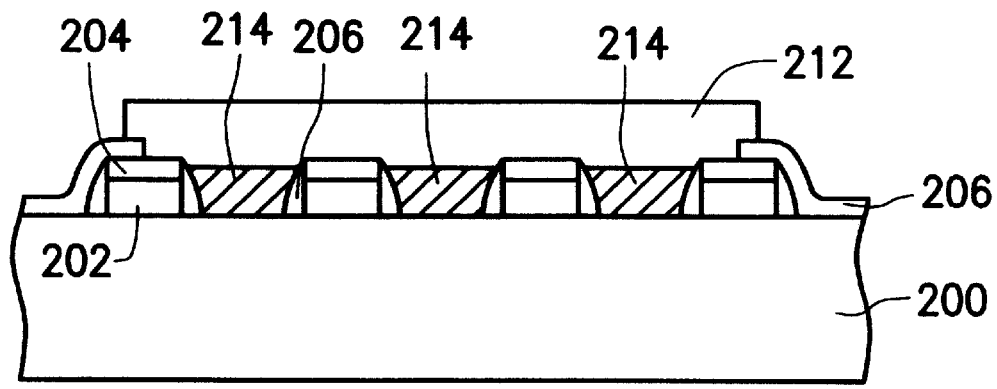

Additionally, the steps of forming the photoresist layer 212 and performing an etching back process on the second conducting layer 210 can be interchanged as shown in FIGS. 3A and 3B.

Referring to FIG. 3A, an etching back process can be performed on the second conducting layer 210 right after the second conducting layer 210 is formed, to expose the first insulator 204. The remains of the second conducting layer 210 include the landing pads 214 and an unwanted portion of the second conducting layer 210, labeled 302 for clarity, located on the second insulator 206.

Referring next to FIG. 3B, a patterned photoresist layer 212 is then formed on the substrate to cover the area that contains landing pads 214. The unwanted portion of the second conducting layer 210, labeled as 302, is removed by using the patterned photoresist layer 212 as a mask. The photoresist layer 212 is removed to accomplish the structure as shown in FIG. 2D.

The specificity of the invention is to provide a method for forming landing pads by using a pattern that covers the locations of a plurality of landing pads. This pattern is different from a conventional pattern that includes separated patterns for each landing pad. The landing pads are formed after a self-aligned etching back process and without the limitation from the photolithography resolution. Hence, the method can be used to form smaller landing pads in a smaller device.

Another specificity of the invention is to provide a method for forming self-aligned landing pads that includes interchangeable steps, so that the method is much easier to accomplish.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for forming a plurality of self-aligned landing pads, the method comprising:

providing a substrate, wherein the substrate contains a patterned first conducting layer, a patterned first insulator, and a patterned second insulator;

forming a second insulator on the substrate;

patterning the second insulator to form a plurality of contact openings, wherein the contact openings expose the substrate;

forming a second conducting layer on the substrate;

forming a photoresist layer on the second conducting layer;

removing a portion of the second conducting layer by using the photoresist layer as a mask, wherein a remaining portion of the second conducting layer is located in a position corresponding to the contact openings;

removing the photoresist layer; and removing the remaining portion of the second conducting layer to form the landing pads in the contact openings.

2. The method of claim 1, wherein the first conducting layer and the second conducting layer include polysilicon.

3. The method of claim 1, wherein the first insulator includes oxide.

4. The method of claim 1, wherein the first insulator includes silicon nitride.

5. The method of claim 1, wherein the second insulator includes oxide.

6. The method of claim 1, wherein the second insulator includes silicon nitride.

7. The method of claim 1, wherein the step of removing the remaining portion of the second conducting layer includes an etching back process.

8. A method for forming a plurality of self-aligned landing pads, the method comprising:

providing a substrate, wherein the substrate contains a patterned first conducting layer, a patterned first insulator, and a patterned second insulator;

forming a second insulator on the substrate;

patterning the second insulator to form a plurality of contact openings, wherein the contact openings expose the substrate;

forming a second conducting layer on the substrate;

removing a portion of the second conducting layer, wherein a remaining portion of the second conducting layer is located in the contact openings as the landing pads and on the second insulator layer;

forming a photoresist layer on the substrate to cover the landing pads;

removing the remaining portion of the second conducting layer located on the second insulator layer by using the photoresist layer as a mask; and removing the photoresist layer.

9. The method of claim 8, wherein the first conducting layer and the second conducting layer include polysilicon.

10. The method of claim 8, wherein the first insulator includes oxide.

11. The method of claim 8, wherein the first insulator includes silicon nitride.

12. The method of claim 8, wherein the second insulator includes oxide.

13. The method of claim 8, wherein the second insulator includes silicon nitride.

14. The method of claim 8, wherein the step of removing the remaining portion of the second conducting layer includes an etching back process.

* * * * *